United States Patent
Park (10) Patent No.: US 6,750,099 B2
(45) Date of Patent: Jun. 15, 2004

(54) METHOD FOR FABRICATING CAPACITOR OF SEMICONDUCTOR DEVICE

(75) Inventor: Won Gyu Park, Daegu (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/320,412

(22) Filed: Dec. 17, 2002

(65) Prior Publication Data
US 2004/0053462 A1 Mar. 18, 2004

(30) Foreign Application Priority Data
Sep. 13, 2002 (KR) .............................. P10-2002-0055784

(51) Int. Cl.[7] .......................................... H01L 21/8242
(52) U.S. Cl. ...................... 438/253; 438/396; 438/397; 438/254
(58) Field of Search ................................ 438/239–242, 438/250–256, 393–399; 257/303–311

(56) References Cited

U.S. PATENT DOCUMENTS

| | | | | |
|---|---|---|---|---|
| 5,114,834 A | * | 5/1992 | Nachshon | 430/329 |
| 5,953,618 A | * | 9/1999 | Choi | 438/396 |
| 6,093,601 A | * | 7/2000 | Tsai et al. | 438/253 |
| 6,143,601 A | * | 11/2000 | Sun | 438/253 |
| 6,197,675 B1 | * | 3/2001 | Fukuzumi et al. | 438/597 |
| 6,211,009 B1 | * | 4/2001 | Carpenter | 438/254 |
| 6,348,259 B1 | | 2/2002 | Hilarius et al. | |
| 6,355,519 B1 | | 3/2002 | Lee | |
| 6,391,724 B1 | * | 5/2002 | Park | 438/279 |
| 6,426,255 B1 | * | 7/2002 | Asano et al. | 438/253 |
| 2001/0000244 A1 | * | 4/2001 | Liao | 438/253 |
| 2001/0050390 A1 | * | 12/2001 | Kawai et al. | 257/301 |
| 2002/0020869 A1 | * | 2/2002 | Park et al. | 257/306 |
| 2003/0124795 A1 | * | 7/2003 | Lee | 438/253 |

* cited by examiner

Primary Examiner—John F. Niebling
Assistant Examiner—Jennifer M. Kennedy
(74) Attorney, Agent, or Firm—Morgan, Lewis & Brokius LLP (57) ABSTRACT

A method for fabricating a capacitor of a semiconductor device is disclosed, in which it is possible to obtain reliability in an etch process, and to simplify manufacturing process steps. The method for fabricating a capacitor of a semiconductor device includes (a) forming plugs in an insulating layer for flattening so as to be in contact with a semiconductor, on which a cell region and a peri-region are defined; (b) forming a material layer for a lower electrode on the insulating layer; (c) forming a dual mask on the material layer for the lower electrode, the dual mask having a first photoresist pattern defining a bottom of the lower electrode, and a second photoresist pattern defining a side part of the lower electrode; (d) forming capacitor lower electrodes in the same shape as the dual mask in the cell region; (e) forming a capacitor dielectric layer on the surface of the capacitor lower electrode; and (f) forming a material layer for an, upper electrode on an entire surface, and selectively patterning the material layer so as to form a capacitor upper electrode and metal lines simultaneously.

18 Claims, 9 Drawing Sheets

METHOD FOR FABRICATING CAPACITOR OF SEMICONDUCTOR DEVICE

This application claims the benefit of Korean Application No. P2002-55784, filed on Sep. 13, 2002, which is hereby incorporated by reference as if fully set forth herein.

BACKGROUND OF THE INVENTION

1. Field of the Invention

The present invention relates to a method for fabricating a semiconductor device, and more particularly, to a method for fabricating a capacitor of a semiconductor device.

2. Discussion of the Related Art

A capacitor of a semiconductor device has been generally made of Oxide-Nitride-Oxide (ONO) dielectric material. However, it is recently required to make a capacitor as a material having high dielectric constant and to manufacture a semiconductor device at a low temperature so as to prevent characteristics of a logic circuit such as a transistor and a capacitor from being changed.

A method for fabricating a capacitor of a related art semiconductor device will be explained with reference to the accompanying drawings. FIG. 1A to FIG. 1J are cross-sectional views illustrating manufacturing process steps of a capacitor of a related art semiconductor device.

Figure 1A:
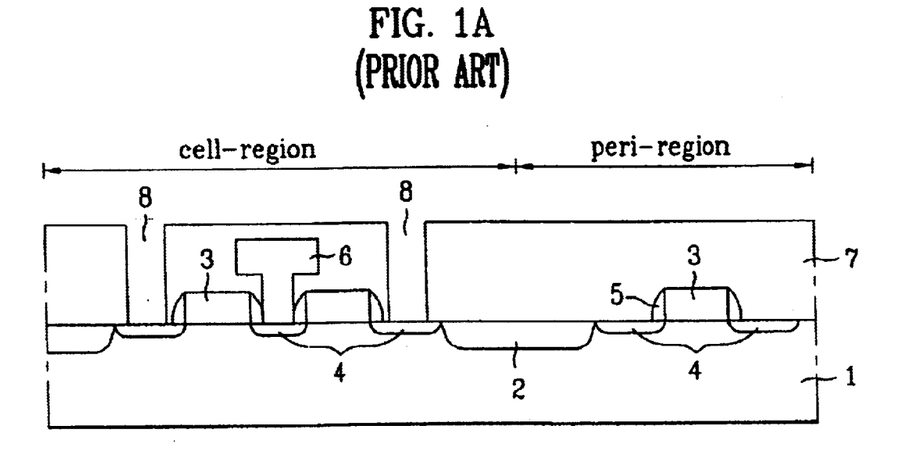
FIG. 1A to FIG. 1J are cross-sectional views illustrating manufacturing process steps of a capacitor of a related art semiconductor device.

Referring to FIG. 1A, a field oxide layer 2 is formed on a semiconductor substrate 1 so as to define an active region, and gates 3 are formed on the semiconductor substrate 1. Then, source and drain 4 are formed at both sides of each gate 3 in the semiconductor substrate 1, and gate sidewalls 5 are formed at both sides of each gate 3 on the semiconductor substrate 1. After forming a bit line 6 being electrically connected with the source and drain 4, a first Inter Layer Dielectric (ILD) layer 7 is formed on an entire surface of the semiconductor substrate 1, and is selectively removed so as to expose the source and drain 4 in a cell region, thereby defining a contact hole 8.

Figure 1B:
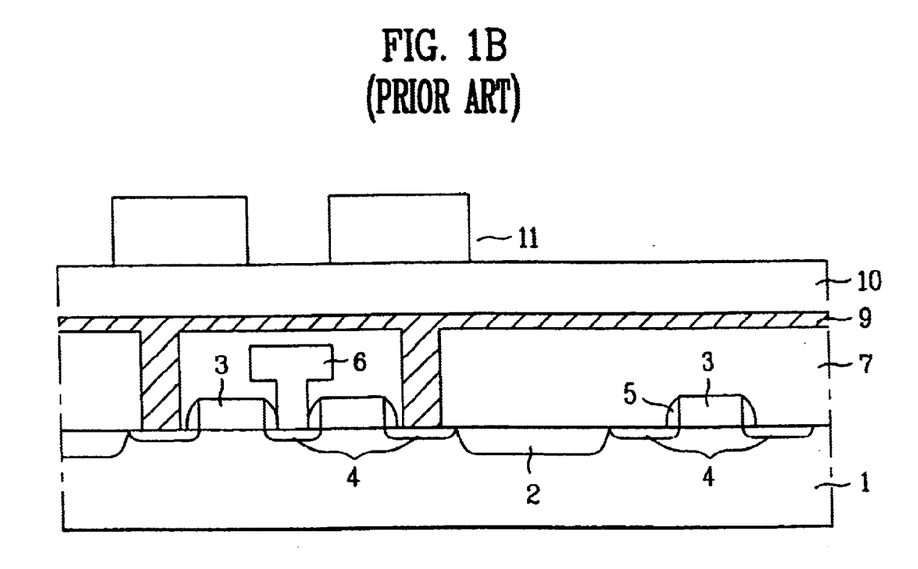
Figure 1C:
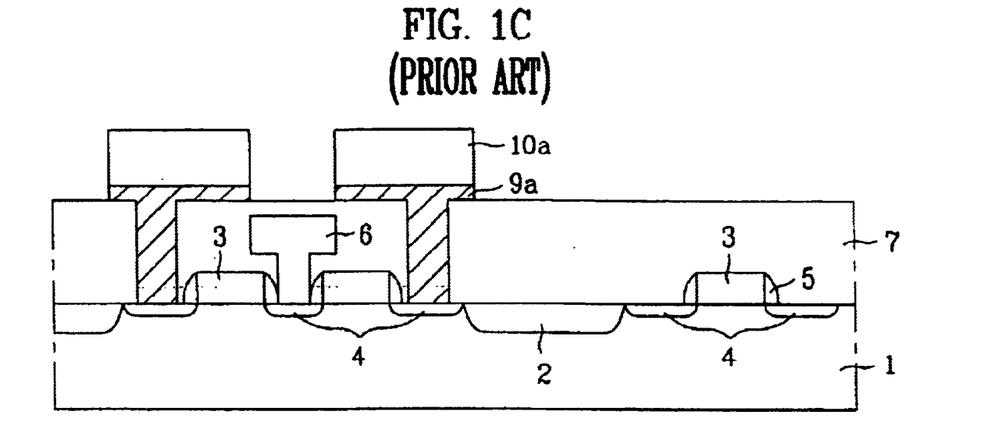

As shown in FIG. 1B, a first doped polysilicon layer 9 is deposited on the first ILD layer 7 having the contact hole 2, and Phosphorous Silicate Glass (PSG) is deposited on the first doped polysilicon layer 9. Subsequently, a photoresist layer is deposited on the entire surface of the semiconductor substrate 1, and a photoresist pattern 11 defining a capacitor region is formed in a process of selectively exposing and developing the photoresist layer. A dry-etch process is performed on the semiconductor substrate 1 using the photoresist pattern 11 as a mask, thereby forming a first doped polysilicon pattern 9a and a PSG pattern 10a, as shown in FIG. 1C. At this time, the first doped polysilicon pattern 9a serves as a bottom of a capacitor lower electrode.

Figure 1D:
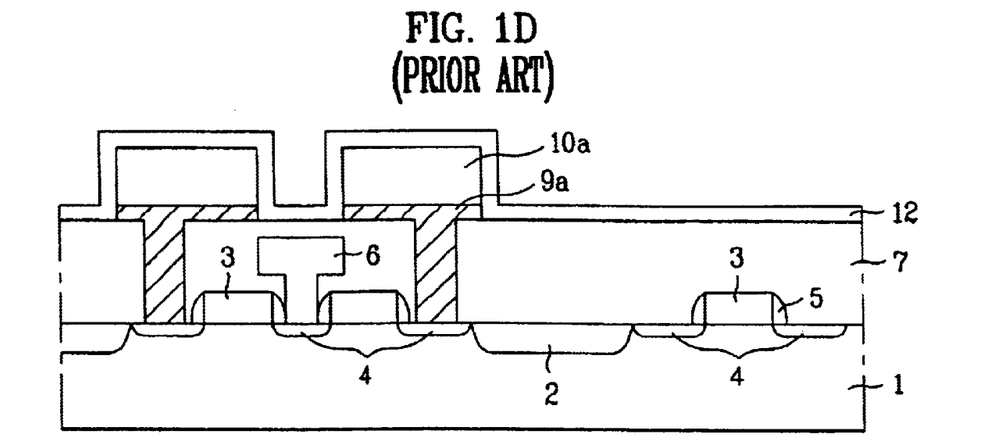
Figure 1E:
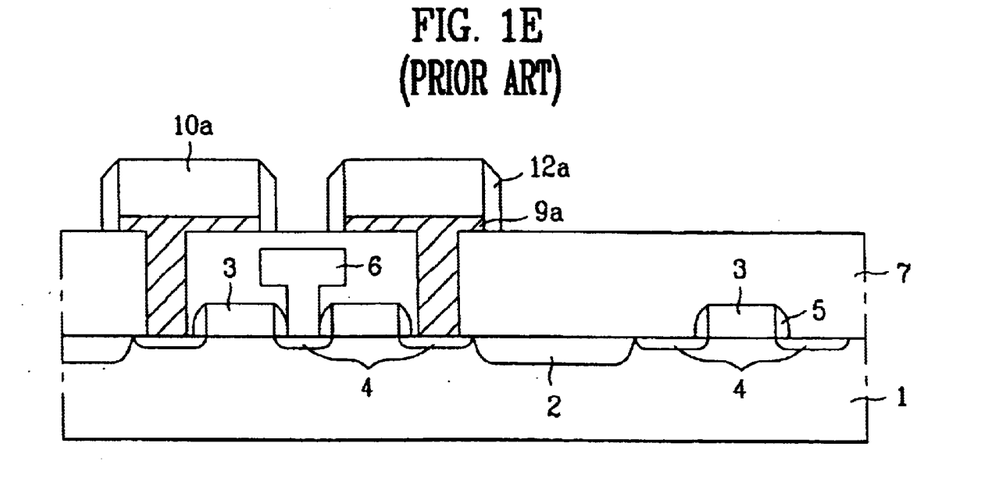

Referring to FIG. 1D, a second doped polysilicon layer 12 is deposited on the entire surface of the semiconductor substrate 1. After that, as shown in FIG. 1E, the dry-etch process is performed to the second doped polysilicon layer 12, so that a second doped polysilicon pattern 12a is formed. At this time, the second doped polysilicon pattern 12a serves as a sidewall of the capacitor lower electrode, and the first doped polysilicon pattern 9a and the second doped polysilicon patter 12a serve as the capacitor lower electrode.

Figure 1F:
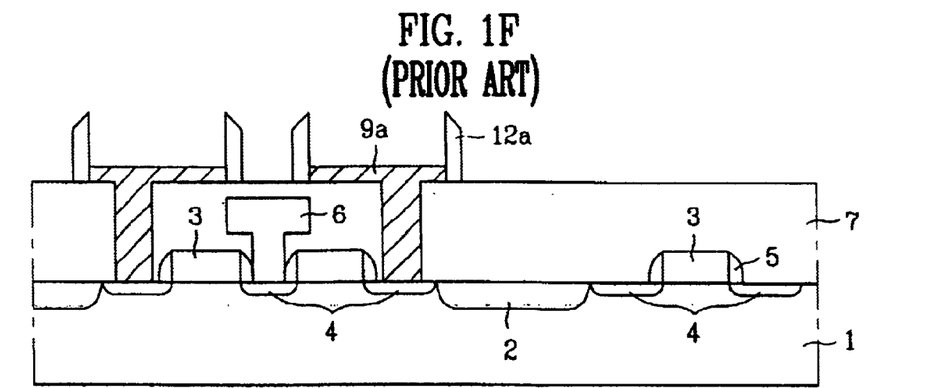
Figure 1G:
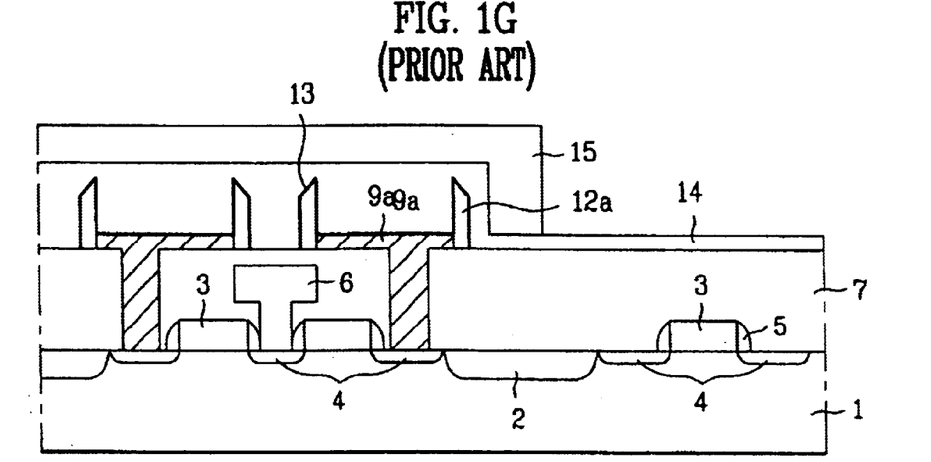

As shown in FIG. 1F, the PSG pattern 10a is removed in a wet-etch process so as to open the capacitor lower electrode 9a and 12a. Next, a capacitor dielectric layer 13 having an Oxide-Nitride-Oxide (ONO) structure is formed on surfaces of the exposed capacitor lower electrode 9a and 12a, as shown in FIG. 1G. In the capacitor dielectric layer 13 having the ONO structure, a native oxide layer, a nitride layer and an oxide layer are sequentially deposited on the surfaces of the capacitor lower electrode 9a and 12a. Then, a third doped polysilicon layer 14 is deposited on the semiconductor substrate 1 so as to form a capacitor upper electrode. The photoresist layer is deposited on the entire surface of the semiconductor substrate 1, and then is selectively removed, so that the photoresist layer remains only on the capacitor region, thereby forming a photoresist pattern 15. The exposed third doped polysilicon layer 14 is selectively etched by using the photoresist pattern 15 as the mask.

Figure 1H:
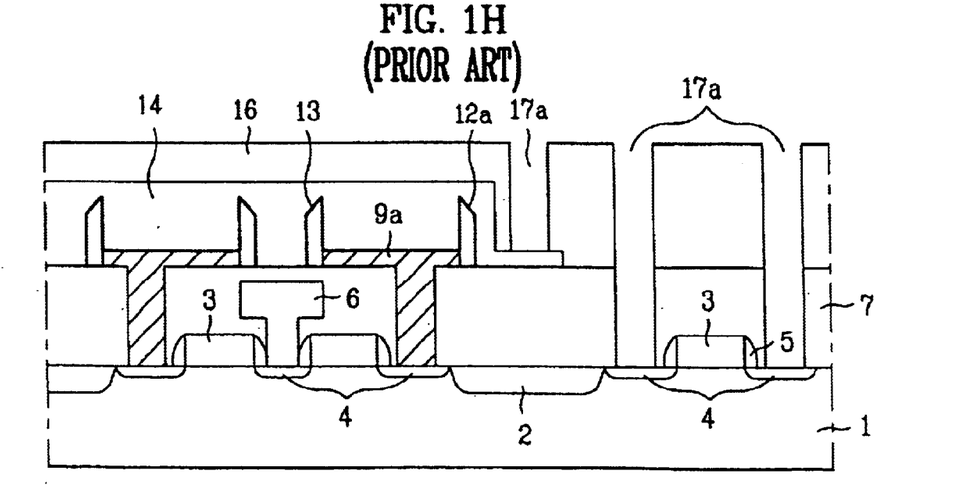
Figure 1I:
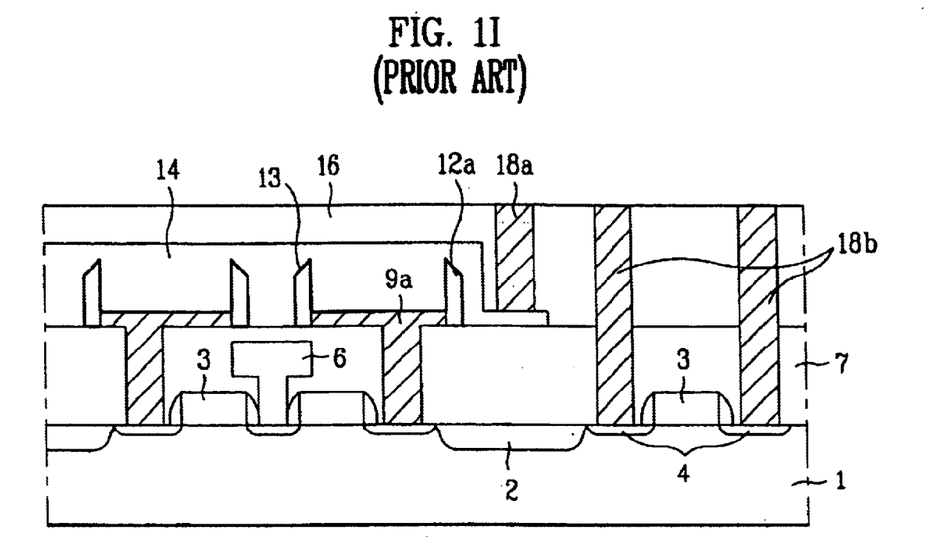
Figure 1J:
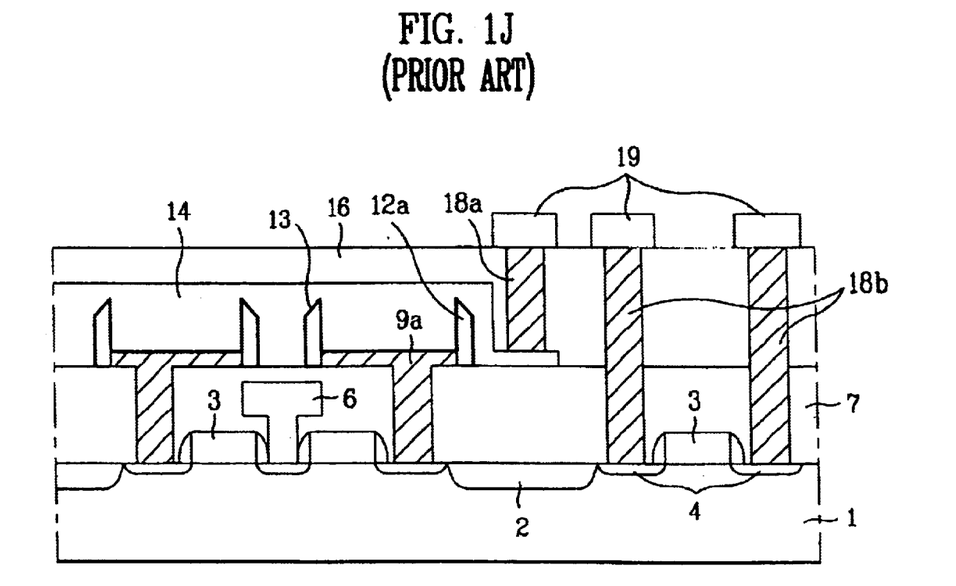

After removing the photoresist pattern 15 in FIG. 1H, a second ILD layer 16 is deposited on the entire surface of the semiconductor substrate 1, and then is flattened. Subsequently, contact holes 17a and 17b for forming inner lines are formed so as to expose a predetermined portion of the third doped polysilicon layer 14 as the capacitor upper electrode, and predetermined portions of the semiconductor substrate 1 on a peri-region. Referring to FIG. 1I, the contact holes 17a and 17b for forming inner lines are buried with plug metal, thereby forming plugs 18a and 18b for inner lines. Then, metal lines 19 are formed on the plugs 18a and 18b for inner lines, as shown in FIG. 1J.

However, the related art method for fabricating the capacitor of the semiconductor device has the following disadvantages.

During manufacturing the capacitor of the semiconductor device, defects may occur to the logic circuit (transistor, capacitor) due to complicated manufacturing process steps. To overcome this problem, it is required to form a repair circuit, so that a size of a chip increases.

Also, when the contact holes 17a and 17b are formed so as to form the plugs 18a and 18b for inner lines, a total thickness of the first and second ILD layers has to be 2000 Å or more, and each contact holes has to have different thickness, thereby complicating the dry-etch process and the burying process of the plug metal. Accordingly, a contact resistance of the plug increases.

Furthermore, the process for oxidizing the nitride layer is maintained so as to form the capacitor dielectric layer having the ONO structure at a high temperature, so that characteristic of the transistor and capacitor may be changed due to the high temperature.

SUMMARY OF THE INVENTION

Accordingly, the present invention is directed to a method for fabricating a semiconductor device that substantially obviates one or more problems due to limitations and disadvantages of the related art.

An object of the present invention is to provide a method for fabricating a capacitor of a semiconductor device, in which it is possible to obtain reliability in an etch process, and to simplify manufacturing process steps.

Another object of the present invention is to provide a method for fabricating a capacitor of a semiconductor device, in which the capacitor of the semiconductor device is manufactured at a lower temperature, so that it is possible to prevent electrical characteristics of the semiconductor device from being changed due to a high temperature during manufacturing process steps.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a capacitor of a semiconductor device includes (a) forming plugs in an insulating layer for flattening so as to be in contact with a semiconductor, on which a cell region and a peri-region are defined; (b) forming a material layer for a lower electrode on the insulating layer; (c) forming a dual mask on the material layer for the lower electrode, the dual mask having a first photoresist pattern defining a bottom of the lower electrode, and a second photoresist pattern defining a side part of the lower electrode; (d) forming capacitor lower electrodes in the same shape as the dual mask in the cell region; (e) forming a capacitor dielectric layer on the surface of the capacitor lower electrode; and (f) forming a material layer for an upper electrode on an entire surface, and selectively patterning the material layer so as to form a capacitor upper electrode and metal lines simultaneously.

Preferably, the plugs are classified into plugs connecting the capacitor lower electrodes to the semiconductor substrate of the cell region, and plugs connecting the metal lines to the semiconductor substrate of the peri-region.

Preferably, the material layer for the lower electrode is made of aluminum at a thickness between 3300 Å and 3600 Å. Also, the material layer for the lower electrode is formed at a temperature between 380° C. and 410° C.

Preferably, forming the dual mask includes forming first photoresist patterns on the plugs of the cell region, performing a hard bake process to the first photoresist patterns, and forming second photoresist patterns at the edges of the first photoresist patterns.

Preferably, the first photoresist patterns are formed at a thickness between 1900 Å and 2100 Å, and the second photoresist patterns are formed at a thickness between 7900 Å and 8100 Å.

Preferably, the capacitor dielectric layer is made of $Al_2O_3$ on the surface of the capacitor lower electrodes at an atmosphere of $O_3$ by an annealing process.

Preferably, the material layer for the capacitor upper electrode is formed by sequentially depositing Al/Ti/TiN, the capacitor upper electrode is formed on the cell region having the capacitor dielectric layer, and the metal lines are formed on the plugs of the peri-region.

In another aspect of the present invention, a method for fabricating a capacitor of a semiconductor device includes (a) forming source and drain in a semiconductor substrate, on which a cell region and a peri-region are defined; (b) forming a first insulating layer for flattening on the semiconductor substrate; (c) forming first lower plugs in the first insulating layer so as to be in contact with the source and drain in the cell region, and second lower plugs in the first insulating layer so as to be in contact with the source and drain in the peri-region; (d) forming a material layer for a lower electrode on the first insulating layer; (e) forming a cylinder shaped dual mask on the material layer for the lower electrode; (f) forming capacitor lower electrodes being in contact with the first lower plugs, and having the same shape as that of the dual mask; (g) forming a capacitor dielectric layer on the surfaces of the capacitor lower electrodes; (h) forming a capacitor upper electrode on a cell region of the capacitor dielectric layer, and metal lines for being in contact with the second lower plugs; (i) forming a second insulating layer for flattening on an entire surface; and (j) forming a first upper plug being in contact with the capacitor upper electrode in the second insulating layer for flattening, and second upper plugs being in contact with the metal lines in the second insulating layer.

Preferably, forming the dual mask includes forming first photoresist patterns on the first lower plugs so as to be formed as a bottom of a cylinder shape; performing a hard bake process to the first photoresist patterns; and forming second photoresist patterns on the edges of the first photoresist patterns so as to be formed as a side part of the cylinder shape.

Preferably, the material layer for the lower electrode is made of aluminum at a thickness between 3300 Å and 3600 Å.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In a capacitor of a semiconductor device according to the present invention, a capacitor dielectric layer is made of $Al_2O_3$ having a dielectric constant three times as great as that in an Oxide-Nitride-Oxide dielectric, and a capacitor lower electrode is formed in a cylinder shape by using a dual mask. Furthermore, manufacturing process steps of manufacturing the capacitor of the semiconductor device according to the present invention are not processed at a high temperature, so that it is possible to prevent characteristics of logic circuits including a transistor and a capacitor from being changed, and to improve yield with simplified manufacturing process steps.

A method for fabricating a capacitor of a semiconductor device using a dual mask according to the present invention will be explained with reference to the accompanying drawings. FIG. 2A to FIG. 2J are cross-sectional views illustrating manufacturing process steps of a capacitor of a semiconductor device according to the present invention.

Figure 2A:
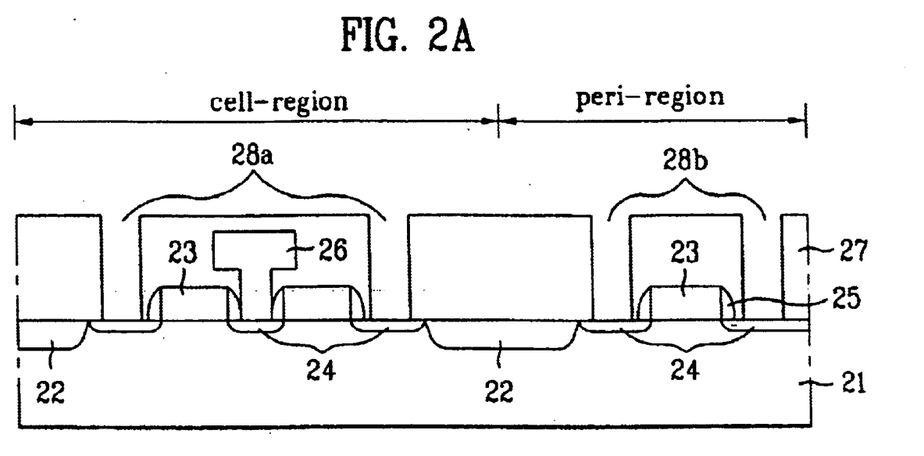
FIG. 2A to FIG. 2J are cross-sectional views illustrating manufacturing process steps of a capacitor of a semiconductor device according to the present invention.

As shown in FIG. 2A, a field oxide layer 22 is formed on a semiconductor substrate 21 so as to define an active region, and a gate insulating layer (not shown) is formed on an entire surface of the semiconductor substrate 21. A doped polysilicon layer and an oxide layer for a cap gate insulating layer are sequentially deposited on the entire surface of the semiconductor substrate 21, and are selectively removed in a photo-etch process using a mask, thereby forming a plurality of gates 23.

Subsequently, source and drain 24 are respectively formed at both sides of each gate 23 in the semiconductor substrate 21 by implanting ions thereto. At this time, the gates are used as masks. After depositing the oxide layer on the entire surface of the semiconductor substrate 21, gate sidewalls 25 are formed at both sides of each gate 23 on the semiconductor substrate 21 by an etch-back process. A bit line 26 is formed for being electrically connected to the source and drain 24. Then, a first insulating layer for flattening 27 is formed as an Inter Layer Dielectric (ILD) layer on the entire surface of the semiconductor substrate 21, and is selectively removed, so that first lower contact holes 28a are formed so as to expose predetermined portions of the source and drain 24 in a cell region, and second lower contact holes 28b are formed so as to expose predetermined portions of the source and drain 24 in a peri-region.

Figure 2B:
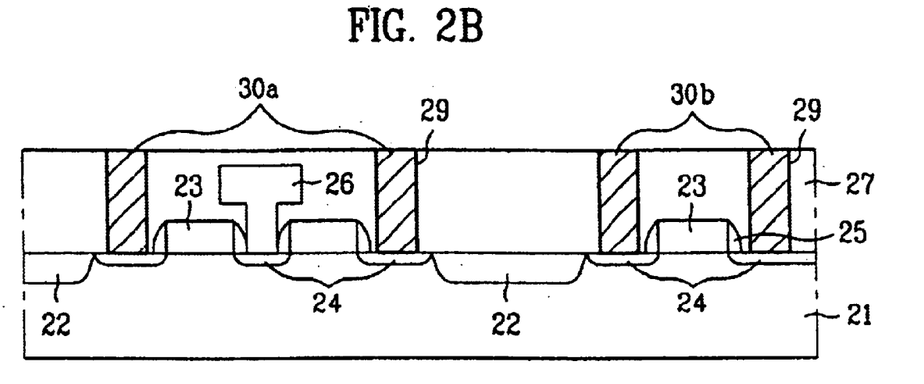

As shown in FIG. 2B, Ti/TiN is deposited on inner surfaces of the first and second lower contact holes 28a and 28b so as to form a barrier layer 29 improving adhesive strength between the source and drain 24 and a plug metal. At this time, Ti is formed at a thickness of 100 Å, and TiN is formed at a thickness of 150 Å. After that, tungsten W for forming a plug is deposited so as to bury the first and second lower contact holes 28a and 28b by a Chemical Vapor Deposition (CVD) process, and a dry-etch process is performed thereto for leaving the tungsten W inside the first and second contact holes 28a and 28b, thereby forming first and second lower plugs 30a and 30b. Accordingly, the first lower plugs 30a being in contact with the source and drain 24 of the cell region is simultaneously formed with the second lower plugs 30b being in contact with the source and drain 24 of the peri-region.

Figure 2C:
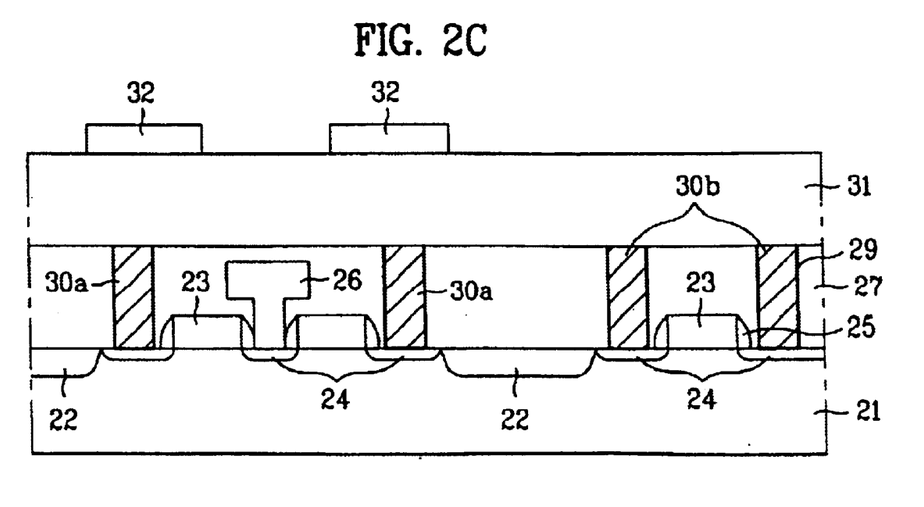

Referring to FIG. 2C, pure aluminum Al is deposited on the entire surface of the semiconductor substrate 21 including the first insulating layer for flattening 27 and the first and second lower plugs 30a and 30b at a thickness between 3300 Å and 3600 Å, thereby forming a material layer 31 for a lower electrode. At this time, the pure aluminum Al is deposited at a low temperature of 380° C. to 410° C. in order to decrease grain size on the surface of the material layer 31 for the lower electrode, thereby preventing a leakage current from generating.

Next, a photoresist layer is deposited on the entire surface of the semiconductor substrate 21, and is selectively removed, so that first photoresist patterns 32 are formed on the cell region so as to define a bottom of a capacitor lower electrode. In this case, the first photoresist patterns 32 are for regulating an etch ratio of the material layer 31 for the lower electrode. If the material layer 31 for the lower electrode is etched at a thickness between 2400 Å and 2600 Å, the first photoresist pattern 32 is formed at a thickness between 1900 Å and 2100 Å. The thickness of the first photoresist pattern 32 is set in due consideration of dry-etch ratio of the photoresist and aluminum. Accordingly, if the etch ratio of the photoresist and aluminum is set at a ratio of 1 to 1, the photoresist pattern 32 and the aluminum are respectively etched at a thickness of 2000 Å. Then, a hard bake process is performed so as to harden the first photoresist patterns 32 at a temperature of 140° C.

Figure 2D:
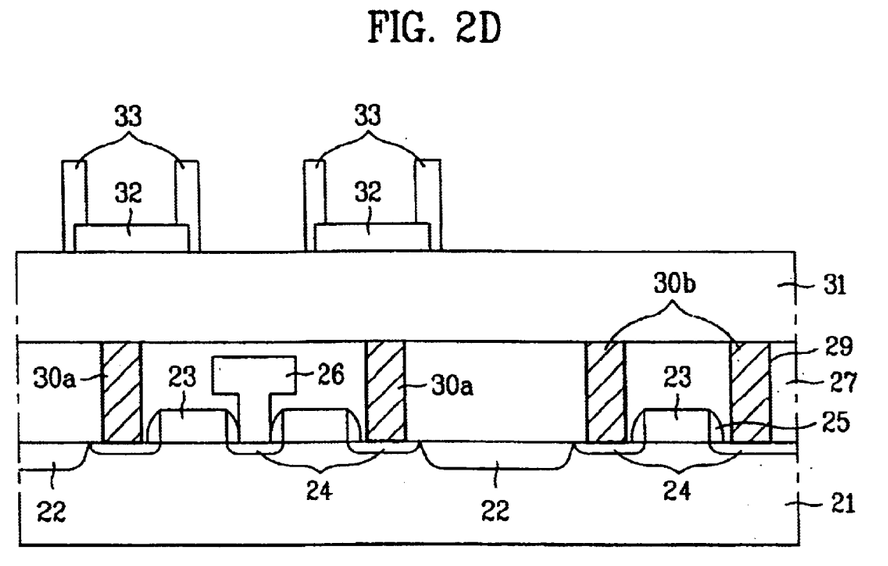

Referring to FIG. 2D, the photoresist layer is deposited on the entire surface of the semiconductor substrate 21, and then the photoresist layer is selectively removed, so that second photoresist patterns 33 are formed on the cell region so as to define a sidewall of the capacitor lower electrode. At this time, the second photoresist patterns 33 are formed at edges of the first photoresist patterns 32 at a thickness between 7900 Å and 8100 Å. During patterning the second photoresist patterns 33, the first photoresist patterns 32 remain without removing since the first photoresist patterns 32 are hardened in the hard bake process. After that, the first photoresist patterns 32 is combined with the second photoresist patterns 33 as a cylinder shape. That is, the first photoresist pattern 32 serves as the bottom of the cylinder shape, and the second photoresist patterns 33 serve as side parts of the cylinder shape.

Figure 2E:
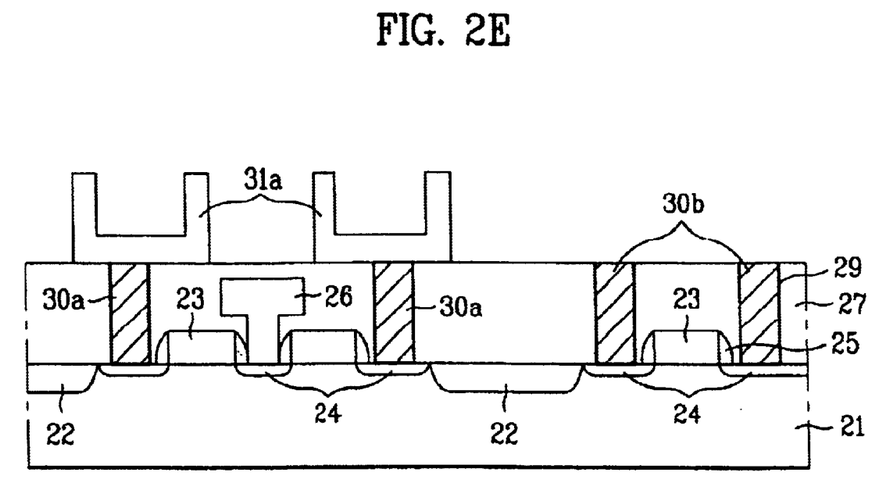

As shown in FIG. 2E, the dry-etch process is performed to the material layer 31 for the lower electrode with the dual mask having the first and second photoresist patterns 32 and 33, so that the exposed material layer 31 for forming the lower electrode is removed, and the predetermined portion of the material layer 31 for the lower electrode being overlapped with the dual mask remains in the same shape of the dual mask. Accordingly, the cylinder shaped capacitor lower electrode 31a is formed for being in contact with the first lower plug 30a.

Figure 2F:
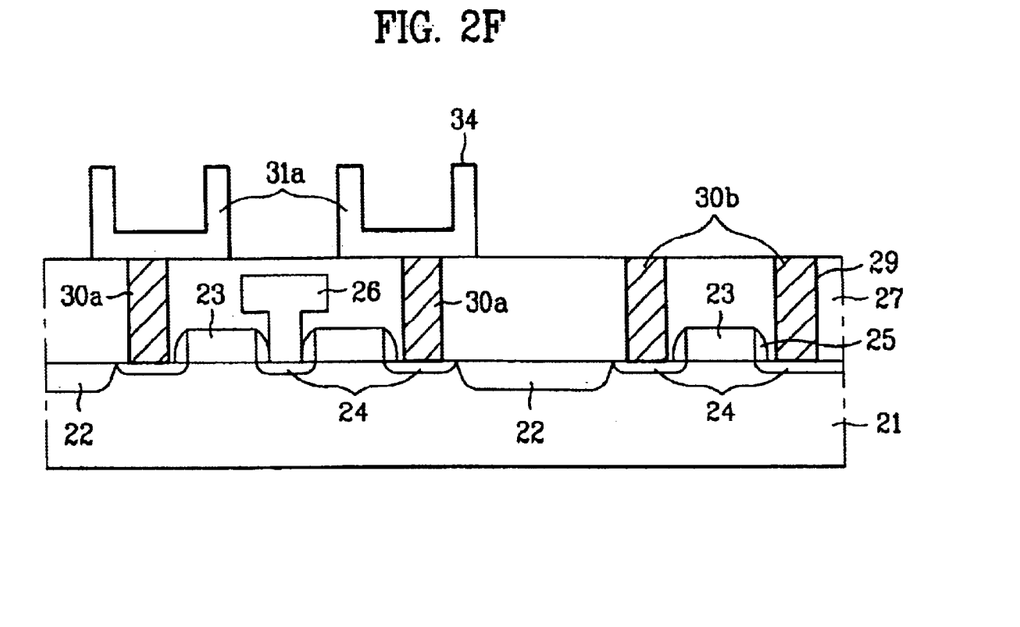

Referring to FIG. 2F, an anneal process is performed to the semiconductor substrate 21 in an atmosphere of $O_3$ at a temperature of 300° C. At this time, a capacitor dielectric layer 34 is formed at a thickness of 50 Å on the surface of the capacitor lower electrode 31a. The capacitor dielectric layer 34 is made of $Al_2O_3$, and the capacitor lower electrode 31a is made of aluminum. During the annealing process, the temperature is maintained at 300° C., which is lower than a melting point of aluminum, so as to prevent characteristics of the capacitor lower electrode from being changed.

Figure 2G:
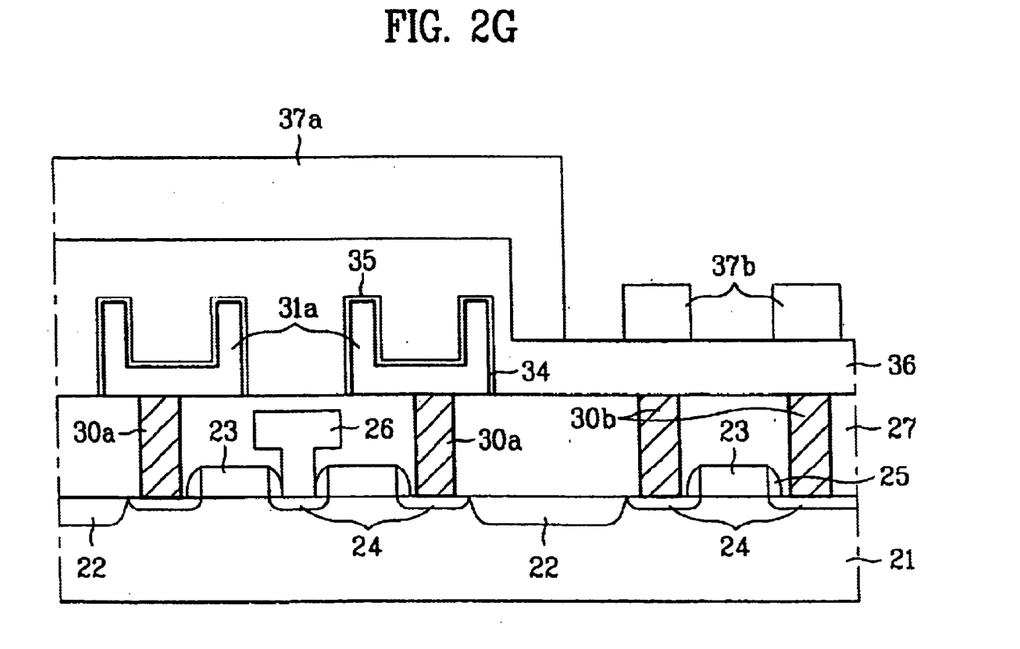

Then, as shown in FIG. 2G, Ti layer 35 is deposited on the surface of the capacitor dielectric layer 34 at a thickness of 100 Å for improving adhesive strength between the capacitor dielectric layer 34 and a material layer 36 for a capacitor upper electrode. Then, the material layer 36 for the capacitor upper electrode is deposited on the entire surface of the semiconductor substrate 21 including the Ti layer 35 in order to form the capacitor upper electrode and metal line. At this time, the material layer 36 for the capacitor upper electrode is formed by sequentially depositing Al, Ti and TiN so as to prevent data from being damaged due to α-particle of data electric charge being stored in the capacitor.

Figure 2H:
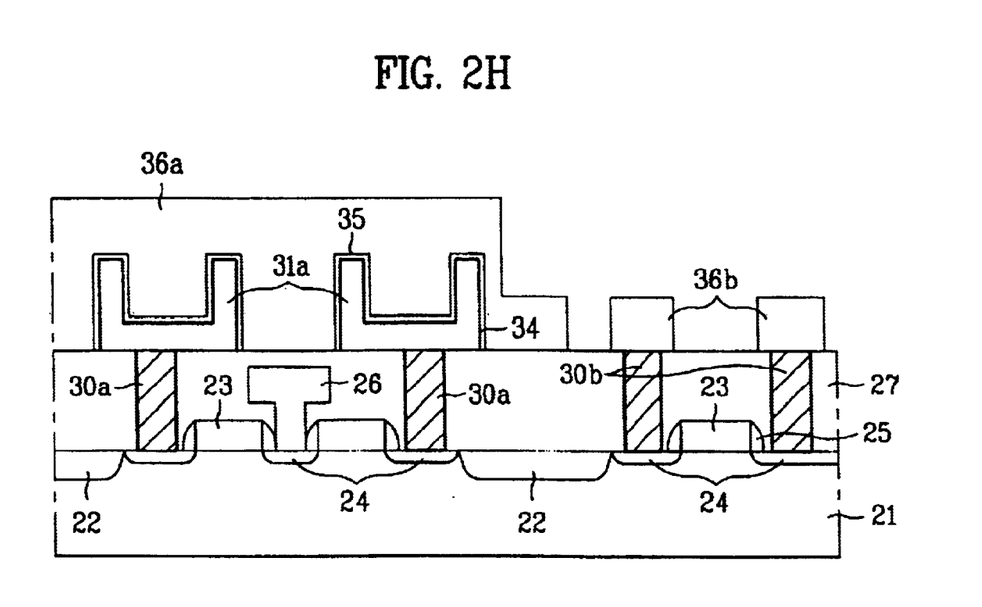

Subsequently, the photoresist layer is deposited on the material layer 36 for the capacitor upper electrode, and then is selectively removed, thereby simultaneously forming third photoresist pattern 37a for forming the capacitor upper electrode, and fourth photoresist pattern 37b for forming the metal line. Referring to FIG. 2H, the material layer 36 for the capacitor upper electrode is selectively etched by using the third and fourth photoresist patterns 37a and 37b as masks, so that the capacitor upper electrode 36a is formed in the cell region and the first metal line 36b is formed in the peri-region.

Figure 2I:
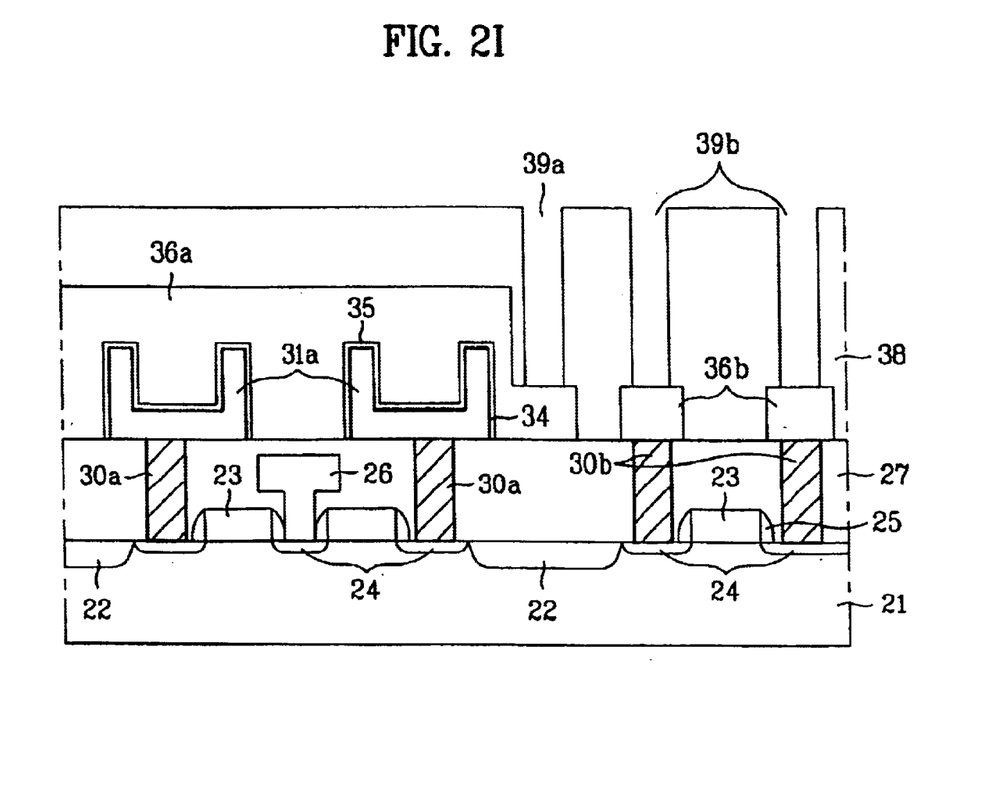

As shown in FIG. 2I, an Inter Metal Dielectric (IMD) oxide layer is deposited on the entire surface of the semiconductor substrate 21, and then is flattened, thereby forming a second insulating layer 38 for flattening. After that, first and second upper contact holes 39a and 39b are formed by selectively etching the second insulating layer 39 for flattening. In this case, the first upper contact hole 39a is formed for exposing a predetermined portion of the capacitor upper electrode 36a, and the second upper contact hole 39b is formed for exposing a predetermined portion of the first metal line 36b in the peri-region.

Figure 2J:
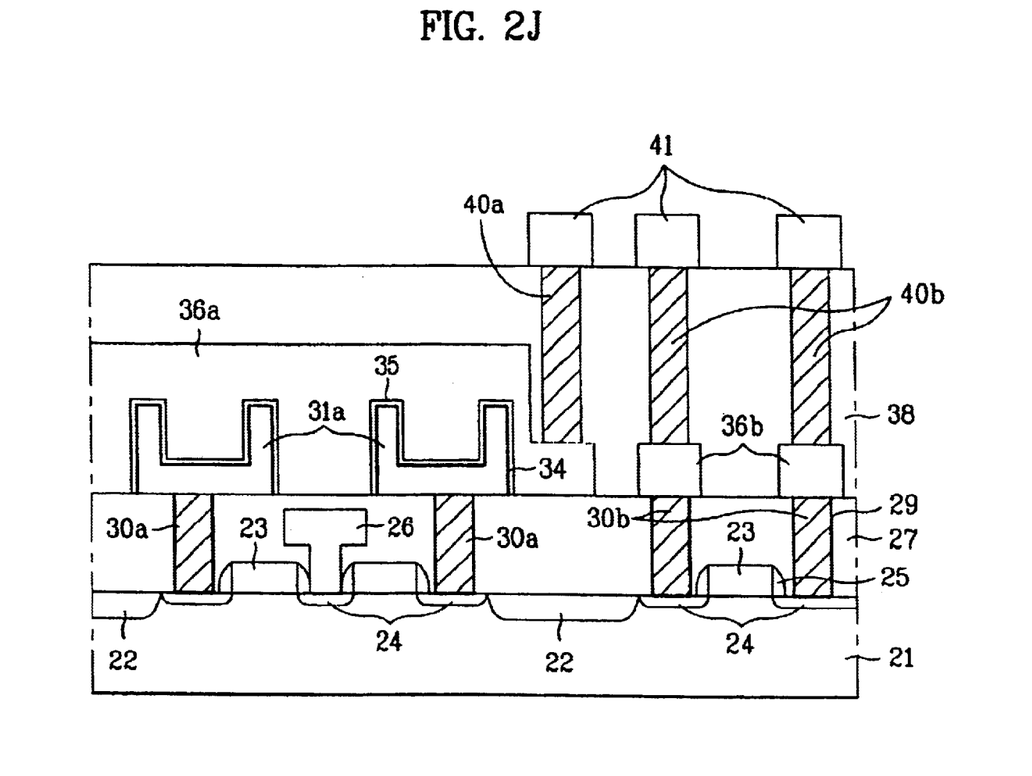

Subsequently, as shown in FIG. 2J, a material layer for plug is deposited on the entire surface of the second insulating layer for flattening 38 so as to bury the first and second upper contact holes 39a and 39b, and then is flattened, thereby forming a first upper plug 40a being in contact with the capacitor upper electrode 36a, and second upper plugs 40b being in contact with the first metal lines 36b. After that, second metal lines 41 are formed for respectively being in contact with the first and second upper plugs 40a and 40b, thereby completing an electric circuit.

In the method for fabricating the capacitor of the semiconductor device using the dual mask according to the present invention, a distance from the first metal line 36b to the semiconductor substrate 21 is same as that from the capacitor lower electrode 31a to the semiconductor substrate 21, thereby improving reliability in the process of forming the contact holes.

As mentioned above, the method for fabricating the capacitor of the semiconductor device using the dual mask according to the present invention has the following advantages.

First, the contact holes of the cell region have the same thickness as the contact holes of the peri-region, thereby improving reliability in the process of forming the contact holes.

The capacitor dielectric layer is made of the material having a higher dielectric constant than that of the ONO structure dielectric, and the capacitor is-formed in the cylinder shape, so that it is possible to decrease a size of the capacitor, thereby improving high integration of the semiconductor device.

In addition, the annealing process is not required in the method for fabricating the capacitor of the semiconductor device according to the present invention, thereby preventing characteristics of capacitor and the gate of the transistor from being changed.

The dual mask is used for forming the capacitor lower electrode, thereby simplifying manufacturing process steps. Accordingly, defects decrease in the process steps of manufacturing the capacitor of the semiconductor device, and manufacturing cost decreases.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a capacitor of a semiconductor device comprising:
    (a) forming plugs in an insulating layer for flattening so as to be in contact with a semiconductor substrate, on which a cell region and a pen-region are defined;
    (b) forming a first material layer on the insulating layer and the plugs;
    (c) forming dual masks on the first material layer; wherein the forming the dual masks includes:
        (c1) forming first photoresist patterns serving bottoms of the dual masks;
        (c2) performing a hard bake process to the first photoresist patterns; and
        (c3) forming second photoresist patterns serving side parts of the dual masks on the edges of the first photoresist patterns by forming a photoresist layer and selectively removing the photoresist layer;
    (d) forming capacitor lower electrodes in the same shape as the dual masks in the cell region;
    (e) forming a capacitor dielectric layer on the surfaces of the capacitor lower electrodes; and
    (f) forming a second material layer on an entire surface, and selectively patterning the second material layer so as to form a capacitor upper electrodes and metal lines simultaneously.

2. The method of claim 1, wherein the first plugs are classified into plugs connecting the capacitor lower electrodes to the semiconductor substrate of the cell region, and plugs connecting the metal lines to the semiconductor substrate of the peri-region.

3. The method of claim 1, wherein the first material layer is made of aluminum at a thickness between 3300 Å and 3600 Å.

4. The method of claim 1, wherein the first material layer is formed at a temperature between 380° C. and 410° C.

5. The method of claim 2, wherein
    the first photoresist patterns are formed over the plugs of the cell region; and
    the second photoresist patterns are formed at the edges of the first photoresist patterns.

6. The method of claim 5, wherein the first photoresist patterns are formed at a thickness between 1900 Å and 2100 Å.

7. The method of claim 5, wherein the hard bake process is performed to the first photoresist patterns at a temperature of about 140° C.

8. The method of claim 5, wherein the second photoresist patterns are formed at a thickness between 7900 Å and 8100 Å.

9. The method of claim 1, wherein the dual masks are formed in a cylinder shape.

10. The method of claim 1, wherein the capacitor dielectric layer is made of $Al_2O_3$ on the surface of the capacitor lower electrodes at an atmosphere of $O_3$ by an annealing process.

11. The method of claim 10, wherein the annealing process is performed at a lower temperature than that of a melting point of the capacitor lower electrodes.

12. The method of claim 1, wherein Ti layer is deposited on the surface of the capacitor dielectric layer so as to improve adhesion strength between the capacitor dielectric layer and the capacitor upper electrodes.

13. The method according to claim 1, wherein the second material layer is formed by sequentially depositing Al/Ti/TiN.

14. The method of claim 1, wherein the metal lines are formed on the plugs of the peri-region.

15. The method of claim 1, further comprising forming an insulating layer on the capacitor upper electrodes and the metal lines, after forming the capacitor upper electrodes and metal lines.

16. The method of claim 15, wherein the insulating layer includes a contact hole for exposing a predetermined portion of the capacitor upper electrodes, and contact holes for exposing the metal lines.

17. A method for fabricating a capacitor of a semiconductor device comprising:
    a) forming sources and drains in a semiconductor substrate, on which a cell region and a peri-region are defined;
    b) forming a first insulating layer for flattening on the semiconductor substrate;
    c) forming first lower plugs in the first insulating layer so as to be in contact with the sources and drains in the cell region, and second lower plugs in the first insulating layer so as to be in contact with the sources and drains in the peri-region;

(d) forming a first material layer on the first insulating layer;

(e) forming a cylinder shaped dual masks on the material layer, wherein the forming the cylinder shaped dual masks includes:
  (e1) forming first photoresist patterns serving bottoms of the dual masks;
  (e2) performing a hard bake process to the first photoresist patterns; and
  (e3) forming second photoresist patterns serving side parts of the dual masks on the edges of the first photoresist patterns by forming a photoresist layer and selectively removing the photoresist layer;

(f) forming capacitor lower electrodes being in contact with the first lower plugs, and having the same shape as that of the dual mask;

(g) forming a capacitor dielectric layer on the surfaces of the capacitor lower electrodes;

(h) forming a capacitor upper electrodes on a cell region of the capacitor dielectric layer, and metal lines for being in contact with the second lower plugs;

(i) forming a second insulating layer for flattening on an entire surface; and (j) forming a first upper plugs being in contact with the capacitor upper electrodes in the second insulating layer for flattening, and second upper plugs being in contact with the metal lines in the second insulating layer.

18. The method of claim 17, wherein the first material layer is made of aluminum at a thickness between 3300 Å and 3600 Å.

* * * * *